(12) United States Patent
Zhang et al.

(10) Patent No.: US 7,815,457 B2
(45) Date of Patent: Oct. 19, 2010

(54) IC SOCKET

(75) Inventors: Jie-Feng Zhang, ShenZhen (CN);
You-Xiang Zheng, ShenZhen (CN);
Mao Lu, ShenZhen (CN)

(73) Assignee: Hon Hai Precisions Ind. Co., Ltd., Taipei Hsien (TW)

( * ) Notice: Subject to any disclaimer, the term of this patent is extended or adjusted under 35 U.S.C. 154(b) by 48 days.

(21) Appl. No.: 12/228,012

(22) Filed: Aug. 8, 2008

(65) Prior Publication Data

US 2009/0061673 A1    Mar. 5, 2009

(30) Foreign Application Priority Data

Aug. 8, 2007    (CN)    .................... 2007 2 0041469 U

(51) Int. Cl.
*H01R 13/625* (2006.01)

(52) U.S. Cl. ..................................... 439/342

(58) Field of Classification Search ................. 439/342, 439/331, 70, 73, 55, 341; 361/728
See application file for complete search history.

(56) References Cited

U.S. PATENT DOCUMENTS

| 6,716,049 B1* | 4/2004 | Gattuso et al. .............. 439/331 |
| 6,821,138 B2 | 11/2004 | Hou |
| 2005/0142920 A1* | 6/2005 | Hashimoto .................. 439/342 |
| 2006/0046530 A1* | 3/2006 | Wang .......................... 439/70 |

* cited by examiner

*Primary Examiner*—Alexander Gilman
(74) *Attorney, Agent, or Firm*—Andrew C. Cheng; Wei Te Chung; Ming Chieh Chang

(57) ABSTRACT

An IC socket comprises a base, a cover moveably mounted to the base, and an actuating mechanism driving the cover to move between a first position and a second position. The base includes a plurality of passageways and at least a rib extending upwardly from a top surface. The cover defines a hole corresponding to the rib and has a plurality of apertures corresponding to the passageways.

20 Claims, 6 Drawing Sheets ical connecting an IC chip to a printed circuit board (PCB)
IC SOCKET

BACKGROUND OF THE INVENTION

1. Field of the Invention

The present invention relates to an integrated circuit (IC) socket, and more particularly, to an IC socket for well supporting an integrated circuit (IC) chip when the IC chip assembled thereto.

2. Description of the Prior Art

A conventional integrated circuit (IC) socket used for electrical connecting an IC chip to a printed circuit board (PCB) typically comprises a base, a plurality of contacts received in the base, a cover mounted upon the base and an actuating element driving the cover sliding on the base. The cover has a plurality of holes for guiding pins of the IC chip to align with the contacts in the base so as to establish a well electrical connection therebetween. In assembly, the IC chip is mounted upon the IC socket and the IC chip usually has a heat sink mounted thereon for transmitting heat for the IC chip. The develop trend of the IC chip operating speed is high, so the heat of the IC chip is generated more and the power of the heat sink need to correspondingly enhance. Accordingly, the heat sink will generate a bigger shake to the IC chip and result in the IC chip warp.

U.S. Pat. No. 6,821,138 issued to Hou on Nov. 23, 2004 discloses a typical IC socket, which is generally referred to a pin grid array (PGA) socket to solve said problem which is described above. As shown in figures, the IC socket includes a base with a plurality of contacts and a cover with thereon a plurality of supporting posts to support the IC chip. The cover is mounted on the base and defines a gap with the base. The IC socket is welded on the PCB by a surface mounted technology that will cause the IC socket warp and lead the supporting posts having different height. During assembly the IC chip, the IC chip may not be stable when come to contact the socket because the supporting posts is formed on the cover which is not so stiff, and a possible gap may be formed between the cover and the base, that makes the cover and the IC chip above warp when the stacked heat sink, IC chip, the socket including the cover and the base are assembled in a tensioned manner. Therefore, an improvement must be needed.

SUMMARY OF THE INVENTION

Accordingly, an object of the present invention is to provide an IC socket with an improved structure to support an IC chip adapt to protect the IC chip from warp and also to provide a structure to lead-in the cover exactly aligned to the base, then establish a well electrical connection between the IC chip and a printed circuit board.

In order to achieve the object set forth, an IC socket comprises a base, a cover moveably mounted to the base, and an actuating mechanism driving the cover to move between a first position and a second position. The base includes a plurality of passageways and at least a rib extending upwardly from a top surface. The cover defines a hole corresponding to the rib and has a plurality of apertures corresponding to the passageways.

In order to further achieve the object set forth, an IC socket comprises a base defining a plurality of passageways extended from a top surface to a bottom surface, a cover mounted upon and moveable relative to the base and having a plurality of apertures corresponding to the passageways, and an actuating mechanism driving the cover to slide between a first position and a second position. The base includes an opening and a plurality of ribs extending from the edges of the opening at the top surface. The cover has a supporting surface and a hole corresponding to the ribs and the ribs extend upwardly beyond the supporting surface. The cover defines a plurality of apertures corresponding to the passageways.

DESCRIPTION OF PREFERRED EMBODIMENT

Reference will now be made to the drawings to describe the present invention in detail.

Figure 1:
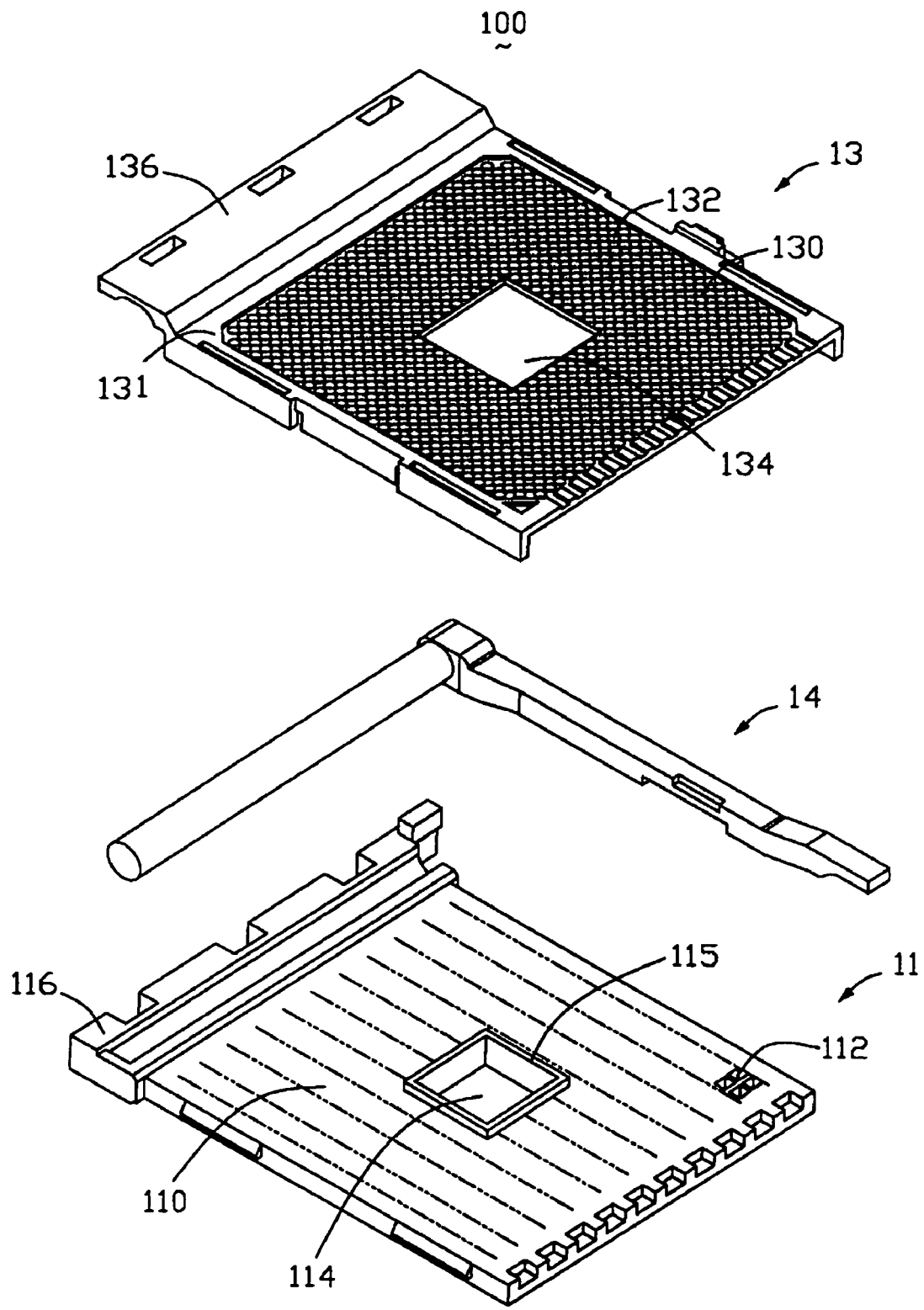
FIG. 1 is an exploded view of a first embodiment of an IC socket in accordance with the present invention.
Figure 2:
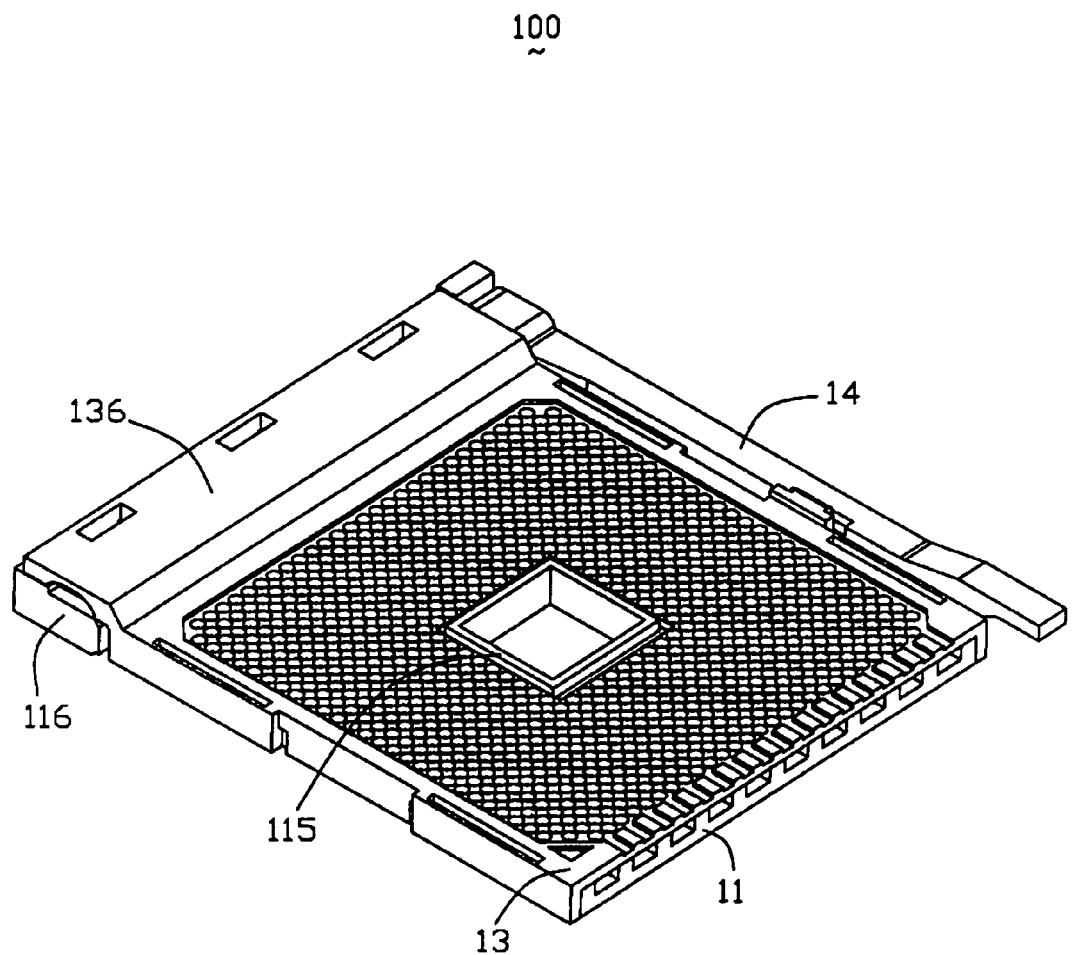
FIG. 2 is an assembled view of the IC socket shown in FIG. 1.

Referring to FIG. 1 and FIG. 2, an IC socket 100 is used for electrically connecting an IC chip (not shown) and a printed circuit board (not shown) and includes a base 11 with a plurality of contacts (not shown) received in the base 11, a cover 13 slidably mounted on the base 11, and an actuating mechanism 14 disposed between the base 11 and the cover 13 to drive the cover 13 moving along the base 11. In present invention, the actuating mechanism 14 is a lever and it is also could is a cam.

The base 11 includes a mating surface 110 opposite to the cover 13. The base 11 defines a plurality of passageways 112 for receiving the contacts and an opening 114 in a center portion thereof. The periphery four sides of the opening 114 has a plurality of ribs 115 extending upwardly from the mating surface 110 for supporting the IC chip to prevent the IC chip from warpage. At one end of the base 11 has a head portion 116 for receiving the actuating mechanism 14. In the present embodiment, the ribs 115 define a continuous close wall and they also could be a plurality of discontinuous walls. The position of the opening 114 is not limited in the center of the base 11 and the number of the opening 114 is not limited one.

The cover 13 is moveably mounted to the base 11 and has a top surface served as a supporting surface 130 for engaging with the IC chip. The cover 13 has a plurality of apertures 132 corresponding to the passageways 112 of the base 11 for guiding pins of the IC chip electrically engaged with the contacts. Referring to FIG. 2, cover 13 has a hole 134 used to the ribs 115 extending therethrough, and the hole 134 is larger than the rib 115 in a lengthwise direction such that the rib 115 can slide in the hole 134 when the cover 13 is driven by the actuating mechanism 14 and slides along the base 11. The periphery of the supporting surface 130 forms a side wall 135 having a same height top surface with the ribs 115. The ribs 115 extend through the hole 134 and cooperate with the side wall 135 to support the IC chip. The cover 13 has a projection 136 corresponding to the head portion 116 of the base 11 to form a recess (not labeled) for receiving the actuating mechanism 14.

In assembly the IC chip to the IC socket 100, put the IC chip on the supporting surface 130 and pins of the IC chip extend through the apertures 132 for electrically engaging with the contacts. Then weld the IC socket to the printed circuit board by solder balls on the contacts. Thus, an electrical connection is established between the IC chip and the printed circuit board. Since the side wall 131 and the ribs 115 are the same height in the top to cooperate supporting the IC chip, the IC chip will not warp easily when the heat sink shakes. Therefore, the life of the IC chip is extended.

Figure 3:
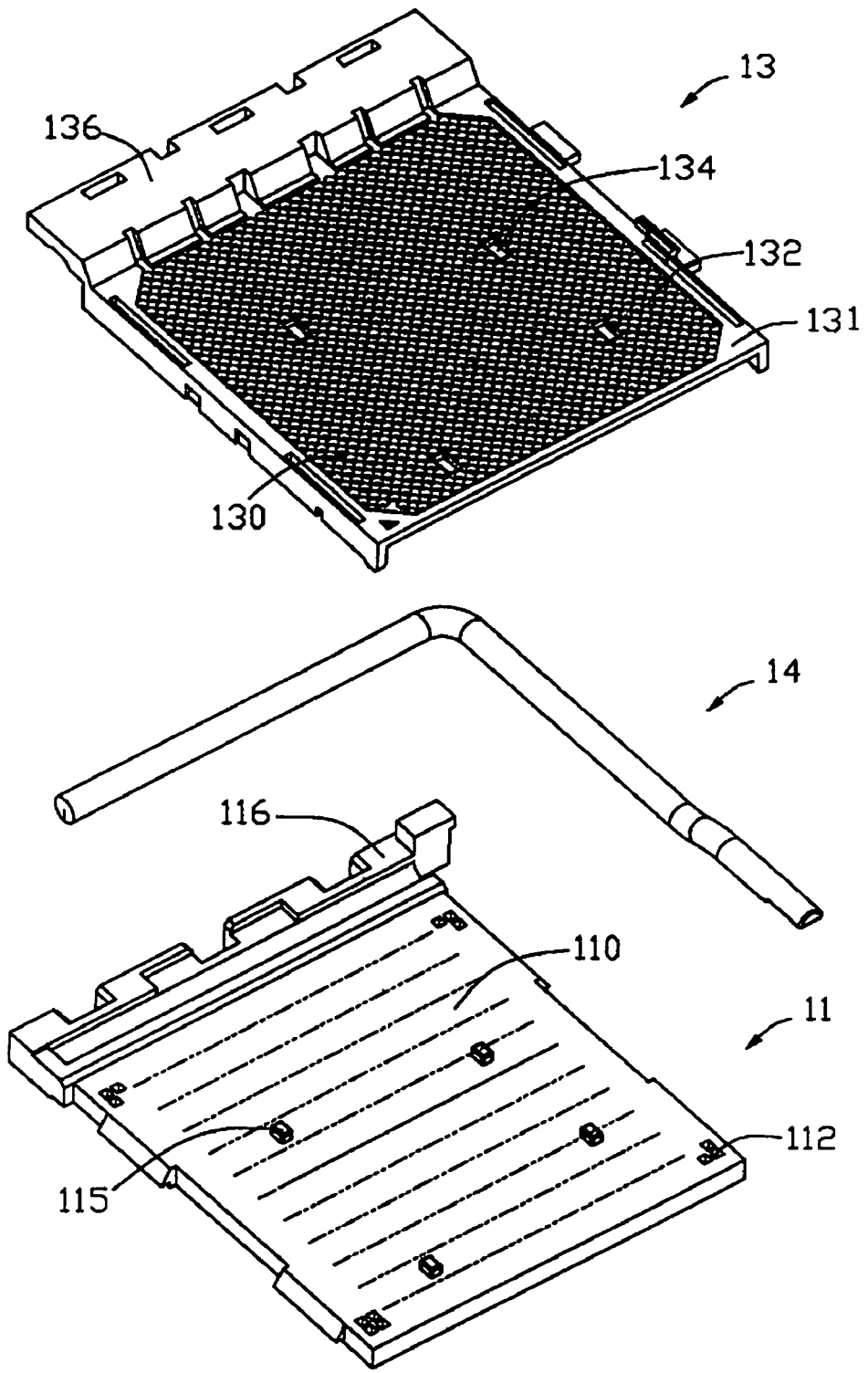
FIG. 3 is an exploded view of a second embodiment of the IC socket in accordance with the present invention.
Figure 4:
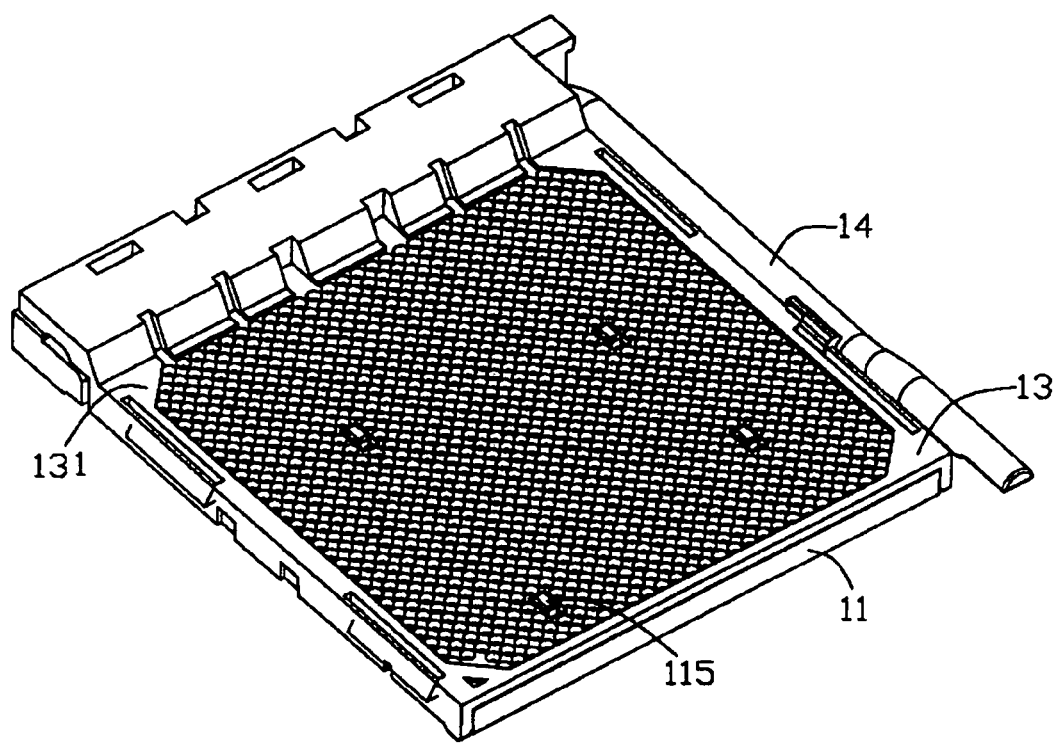
FIG. 4 is an assembled view of the IC socket shown in FIG. 3.

Referring to FIG. 3 and FIG. 4, which is the second embodiment of present invention. The IC socket comprises a base 11 having a plurality of passageways 112. The area of the passageways 112 formed a conductive area. The conductive area extends a plurality of protrusions 115 between the passageways. The protrusions 115 are nonuniform distribution in the conductive area. The cover 13 has a plurality of holes 134 and the protrusions 115 are extending through the holes 134 to support the IC chip. Referring to FIG. 4, the hole 134 has an enough room for the protrusion 115 sliding in the hole 134 along with the cover 13.

In this embodiment, the protrusions 115 could be solid and each have a flat upper surface. The protrusions 115 also could be hollow. The protrusions 115 nonuniform locate on base 11. Alternatively, the protrusions 115 could uniform dispose on base 11.

Figure 5:
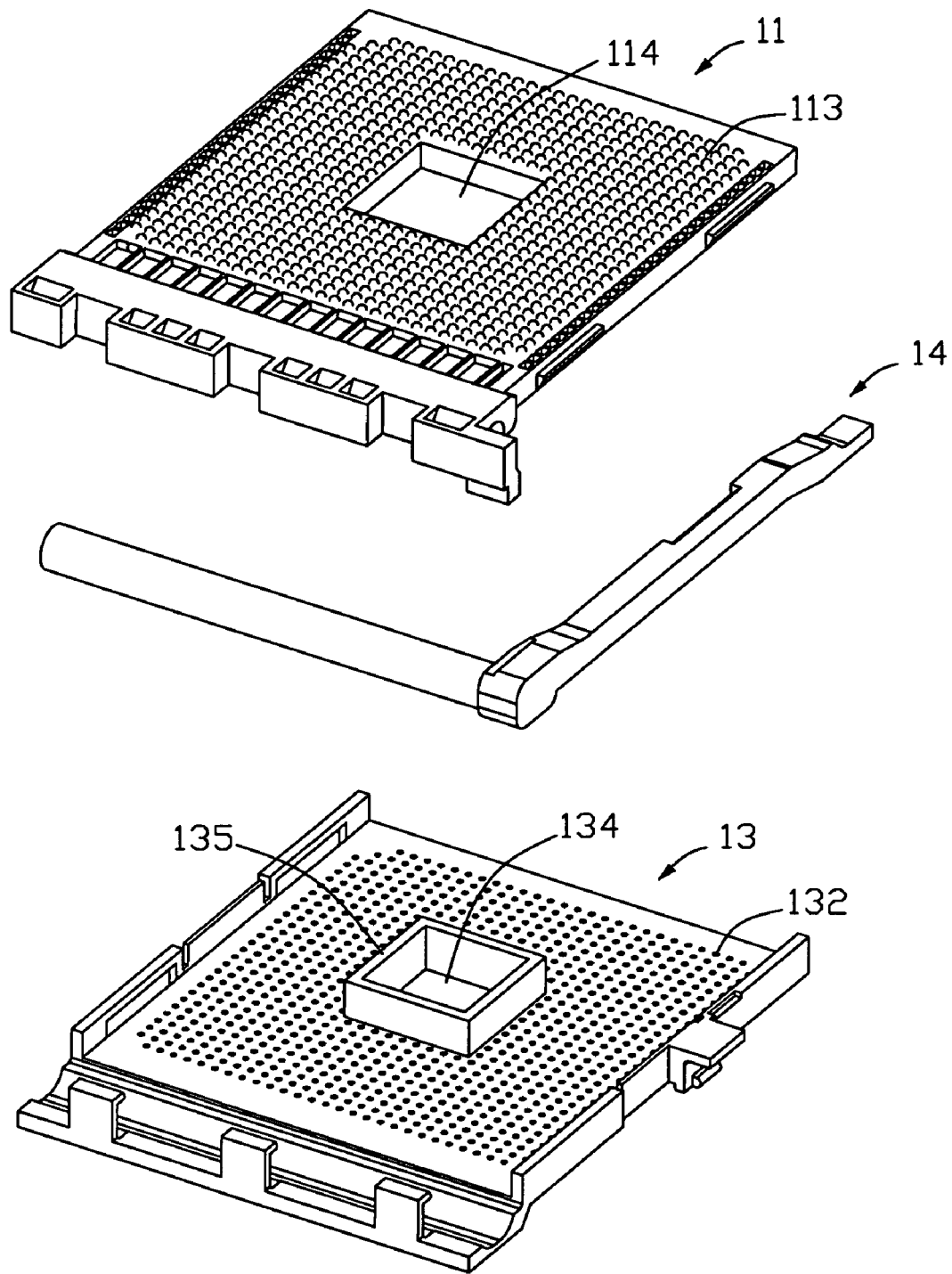
FIG. 5 is an exploded view of a third embodiment of the IC socket in accordance with the present invention.
Figure 6:
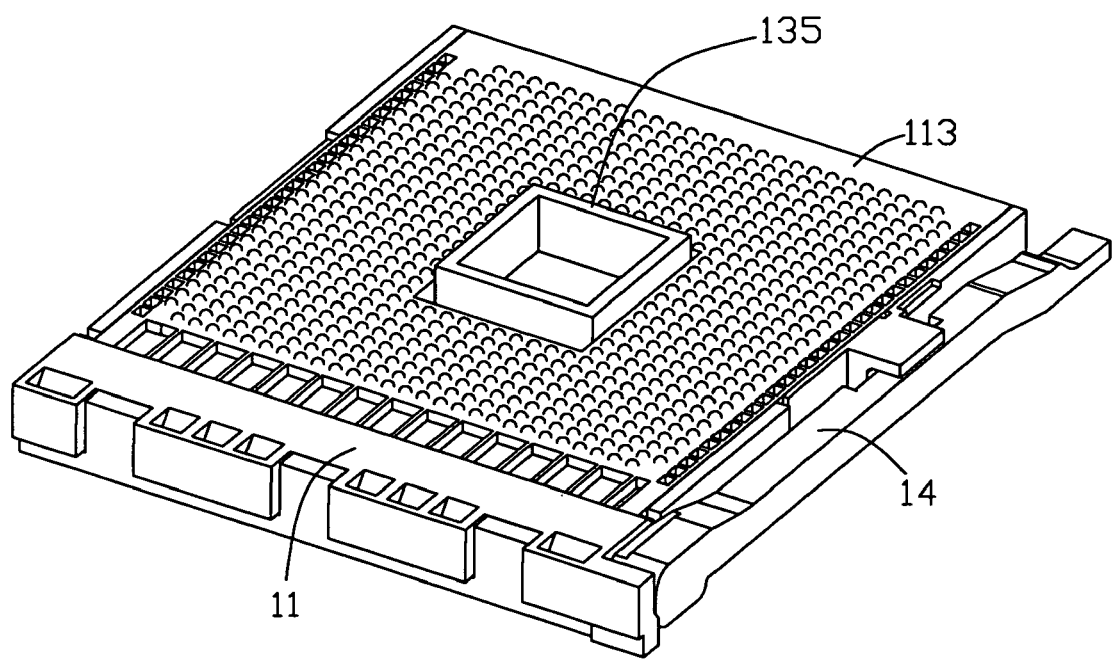
FIG. 6 is an assembled view of the IC socket shown in FIG. 5.

Referring to FIG. 5 and FIG. 6, which is the third embodiment of the present invention and which is substantially similar to the first embodiment. In this embodiment, the cover 13 defines a hole 134 in a substantially center thereof. At least a rib 135 is positioned at the edge of the hole 134 formed a close wall and extends from a bottom surface of the cover 13. The base 11 has an opening 114 in the substantially center thereof. The rib 135 is adapted to lead the cover 13 into the opening 114 of the base 11 and extends beyond or at the same planer of the bottom surface 113 of the base 11. The rib 135 is use to lead-in and orientates the cover 13 aligned exactly right to the position of the base 11.

One common principle of the present invention is to provide the structure having a function that could lead-in and orientate the cover 13 aligned exactly right to the position of the base 11. In the first and second embodiments the rib 115 also has a function for supporting the IC chip additionally. It is very important that in the first and third embodiments, the rib 115, 135 only occupies the peripheral region of the central opening 114, 134 so as to not only provide the original aligning/supporting function but also allow heat transfer via the remaining portion of the central opening 114, 134. It can be noted that in the first embodiment the opening 134 should be a little bit larger than the area formed by the rib 115 so as to allow the cover 13 to move back and forth relative to the base 11. For the same reason, in the third embodiment the opening 114 is a little bit larger than the rib 135. Understandably, for functioning to support the IC chip, in an alternate/fourth embodiment (no drawing provided herewith) it is also possible to modify the rib 135 and the base to have the rib 135 abut against a step structure of the base 11 around a peripheral region of the opening 114, under a condition that the rib 135 further upwardly extending with the post (as shown in the aforementioned U.S. Pat. No. 6,821,138) being coplanar with the top surface of the side wall 131. In this situation, such upwardly extending post formed on the cover 11 is supported not only by the cover 13 but also by the base 11 so as to provide the IC-supporting function reliably. Anyhow, in the fourth embodiment, it is advantageous to keep most portions of the center opening 114, 134 vacant for heat transfer, as mentioned earlier in the first and third embodiments while also providing aligning/supporting function.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An IC socket comprising:
   a base including a plurality of passageways and at least a rib extending upwardly from a top surface;
   a cover moveably mounted to the base, the cover defining a through hole corresponding to the rib which passes through the through hole and protrudes beyond a top surface of the cover, and a plurality of apertures corresponding to the passageways; and
   an actuating mechanism driving the cover to move between a first position and a second position.

2. The socket as claimed in claim 1, wherein the base has an opening disposed in a substantially center portion thereof and the rib is defined at sides of the opening extending through the hole of the cover.

3. The socket as claimed in claim 2, wherein the rib form a close wall.

4. The socket as claimed in claim 3, wherein the rib has a planar upper surface.

5. The socket as claimed in claim 1, wherein the actuating mechanism is a cam or a lever.

6. The socket as claimed in claim 1, wherein the ribs form between the passageways.

7. The socket as claimed in claim 6, wherein each rib has a flat upper surface.

8. The socket as claimed in claim 6, wherein the rib is hollow.

9. The socket as claimed in claim 6, wherein the ribs are evenly distribution.

10. The socket as claimed in claim 6, wherein the ribs are nonuniform distribution.

11. An IC socket comprising:
    a base defining an opening and a plurality of passageways surrounding the opening extending from a top surface to a bottom surface, the base defining a plurality of ribs from the edges of the opening at the top surface;
    a cover moveably mounted to the base, the cover having a supporting surface and defining a hole corresponding to the ribs which extend upwardly beyond the supporting surface, the cover defining a plurality of apertures corresponding to the passageways; and
    an actuating mechanism driving the cover to slide between a first position and a second position.

12. The socket as claimed in claim 11, wherein the opening is disposed in a substantially center portion of the base.

13. The socket as claimed in claim 11, wherein the ribs form a close wall.

14. An IC socket assembly comprising:
    an insulative base defining a center opening extending vertically therethrough, and a plurality of vertical passageways;
    an insulative cover mounted upon the base and back and forth moveable relative to the base in a front-to-back direction, and defining a plurality of apertures and a center opening both extending vertically therethrough; and
    at least one of said base and said cover defining a rib structure along a periphery region of the corresponding center opening and toward another periphery region of another center opening of the other of said base and said cover in an alignment manner so as to achieve at least a lead-in function during assembling the cover to the base, wherein
    most portions, except the periphery region, of the center opening of each of the base and the cover is vacant for efficient heat transfer consideration.

15. The socket assembly as claimed in claim 14, wherein the rib structure also provides a guiding function during back-and-forth movement of the cover with regard to the base.

16. The socket assembly as claimed in claim 14, wherein said rib structure is formed on the cover and extends downward.

17. The socket assembly as claimed in claim 16, wherein said rib structure extends beyond, with a minor distance, a bottom surface of the base around the center opening of the base.

18. The socket assembly as claimed in claim 16, wherein the rib structure formed on said one of the cover and the base, intimately abuts against the other of said cover and the base in a transverse direction perpendicular to said front-to-back direction.

19. The socket assembly as claimed in claim 14, wherein said rib structure includes a post structure extending above, with a minor distance, an upper surface around the center opening of the cover for directly abutting against a bottom face of an IC package which is seated upon the cover, via support from the base.

20. The socket assembly as claimed in claim 19, wherein said rib structure is formed on the base and extends upwardly.

* * * * *